United States Patent [19]

Finch

[11] Patent Number: 4,687,990
[45] Date of Patent: Aug. 18, 1987

[54] BRUSH POTENTIAL CURVE TRACER

[75] Inventor: Hilvan A. Finch, Schenectady, N.Y.

[73] Assignee: The United States of America as represented by the United States Department of Energy, Washington, D.C.

[21] Appl. No.: 747,202

[22] Filed: Jun. 21, 1985

[51] Int. Cl.$^4$ ...................... G01R 31/02; H02K 11/00
[52] U.S. Cl. ........................... 324/158 MG; 310/68 B
[58] Field of Search ............... 324/158 MG; 340/648; 318/361, 541; 310/68 B

[56] References Cited

U.S. PATENT DOCUMENTS

| | | | |
|---|---|---|---|
| 2,516,615 | 7/1950 | Butler | 324/158 MG |
| 2,752,568 | 6/1956 | Ward | 324/158 MG |
| 2,754,464 | 7/1956 | Wizenez et al. | 318/434 |
| 3,727,133 | 4/1973 | Marvin et al. | 324/158 MG |
| 3,980,950 | 9/1976 | Kutsevalov et al. | 324/158 MG |
| 4,025,808 | 5/1977 | Grengg et al. | 310/68 B |
| 4,145,653 | 3/1979 | Voigt | 324/158 MG |
| 4,348,629 | 9/1982 | Sievers | 324/158 MG |
| 4,377,784 | 3/1983 | Saito et al. | 324/158 MG |

FOREIGN PATENT DOCUMENTS

| | | | |
|---|---|---|---|
| 2162896 | 6/1973 | Fed. Rep. of Germany | 324/158 MG |
| 0052869 | 3/1982 | Japan | 324/158 MG |
| 661232 | 5/1979 | U.S.S.R. | 324/158 MG |

Primary Examiner—Ernest F. Karlsen
Attorney, Agent, or Firm—William W. Randolph; Judson R. Hightower; Richard E. Constant

[57] ABSTRACT

A device for analyzing commutating characteristics of a motor or generator includes a holder for supporting a plurality of probes adjacent a brush of the motor or generator. Measurements of electrical current characteristics in each of the probes provides information useful in analyzing operation of the machine. Methods for employing a device in accordance with the invention are also disclosed.

4 Claims, 6 Drawing Figures

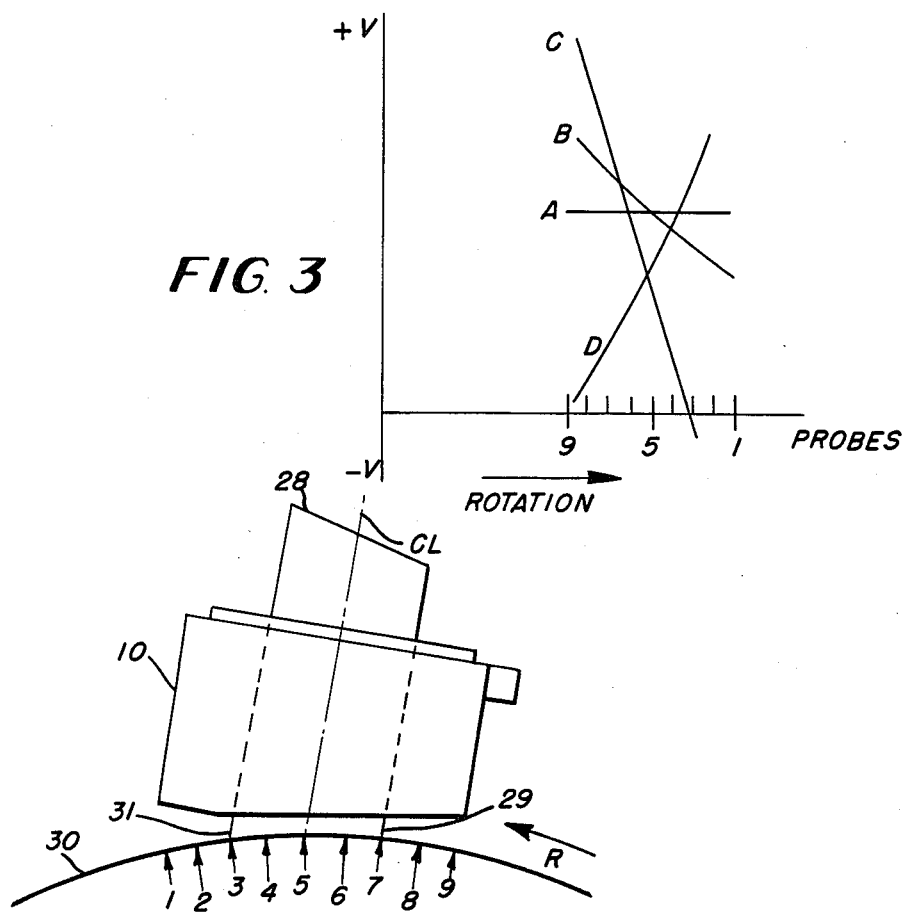
FIG. 3
FIG. 4
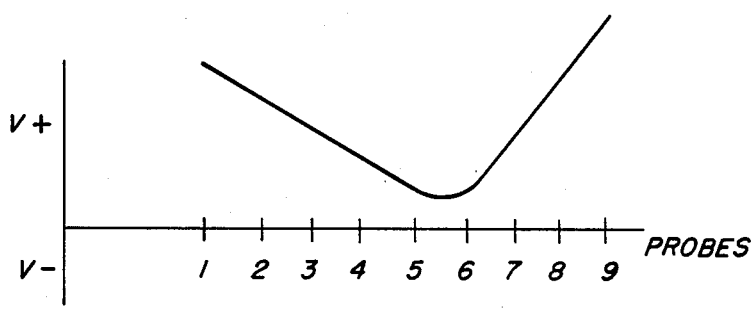
FIG. 5A
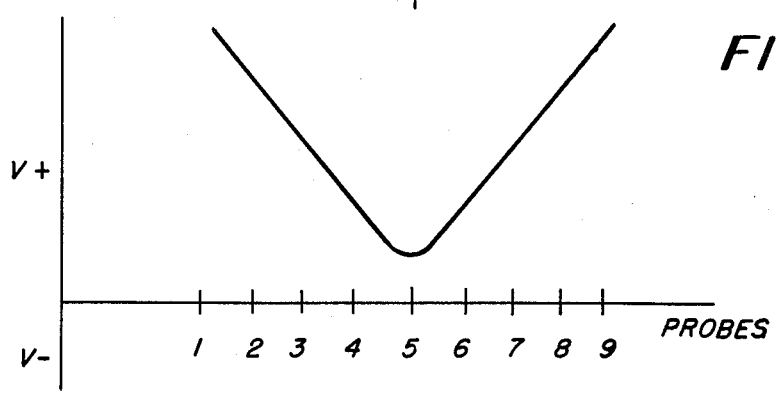
FIG. 5B

BRUSH POTENTIAL CURVE TRACER

FIELD OF THE INVENTION

The present invention relates to devices and methods for determining the commutating characteristics of electric motors and generators.

BACKGROUND OF THE INVENTION

An electric motor or generator typically includes a commutator and a brush in contact with the commutator for conducting electric current thereto. It is often necessary to analyze the commutating characteristics of a motor or generator. This might be done, for example, in order to determine if the brush is accurately positioned so as to be in contact with the rotating commutator at desired times, to determine if the motor or generator is operating in an efficient manner, etc.

A known method of determining DC neutral and other commutating characteristics of a machine, such as a motor or generator, employs a probe formed of an ordinary writing pencil having a portion of the wood material thereof removed, thereby exposing the lead. A strand of wire is wrapped about the pencil in such manner as to contact the lead. The other end of the wire is connected to a voltmeter. The probe is then run along the edge of the commutating brush in order to obtain voltage readings along the bush as the machine is brough up to load.

The difficulty with this "pencil neutral" method is that it is extremely dangerous and hazardous, requiring the operator to be inside the machine while it is operating under various loads. Additionally, once measurements are taken and recorded, it may be extremely difficult to ascertain the precise location at which each measurement was taken. The usefulness of data thus obtained is severaly limited when the data cannot be accurately related back to the machine.

Accordingly, it is an object of the present invention to provide both means and method for accurately determining commutating characteristics of a machine such as a motor or generator.

An object is to provide such means which will provide data in a manner such that the data may be accurately related to the apparatus from which it was obtained.

A further object is to provide a device and method for enabling safe and efficient analysis of commutator characteristics.

The invention provides a device which may be used to determine commutating characteristics of a machine with the machine in place, without the removal thereof to another location for testing.

The present invention further provides means and method for accurately positioning a brush with respect to a commutator.

SUMMARY OF THE INVENTION

The invention provides, in a motor or generator having a commutator and a brush, means for determining commutating characteristics of the apparatus. The invention comprises first means for positioning plural probes in juxtaposition with the brush and in contact with the commutator and second means for measuring electrical current characteristics of the respective probes. Particularly, a plurality of carbon probes are mounted in a holder which is adapted to be mounted on or alongside a brush holder. The probes are on fixed and known centers which extend alongside the commutating brush, and are in constant contact with the commutator. In operation, electrical current characteristics are analyzed for each probe, whereby the commutating characteristics of the machine may be determined.

Once the device of the invention is installed in a machine, an operator may take necessary measurements without reaching into the machine during operation thereof. Hazards of shock and burns and the like are thereby eliminated.

The potential curve tracer of the invention is especially designed for transient analysis and provides a simple way of systematically resolving manufacturing and operational problems by indicating the current in a commutating brush at various points along the brush and at points beyond the brush. The device may therefore be used to indicate the exact location of the brush in the commutating zone. It may also be used on any motor or generator to locate a DC neutral, to determine the condition of the commutating field, or to diagnose an armature or rotor which is rewound. This may all be accomplished without extensive instrumentation. Only a voltmeter having a measuring range of 0-10 volts is required.

BRIEF DESCRIPTION OF THE DRAWINGS

The features and advantages of the present invention will be better understood in light of the following description considered together with the accompanying drawings in which:

FIG. 3 is a graph showing possible measurements which might be obtained when using the device to determine commutating characteristics of a generator;

FIG. 4 is a schematic illustration of the inventive device for the purpose of illustrating the manner in which it might be used to properly locate a brush in a commutating zone; and FIGS. 5A-5B are graphs illustrating measurements which might be obtained using the device in the manner depicted in FIG. 4.

DETAILED DESCRIPTION OF A PREFERRED EMBODIMENT

Figure 1:
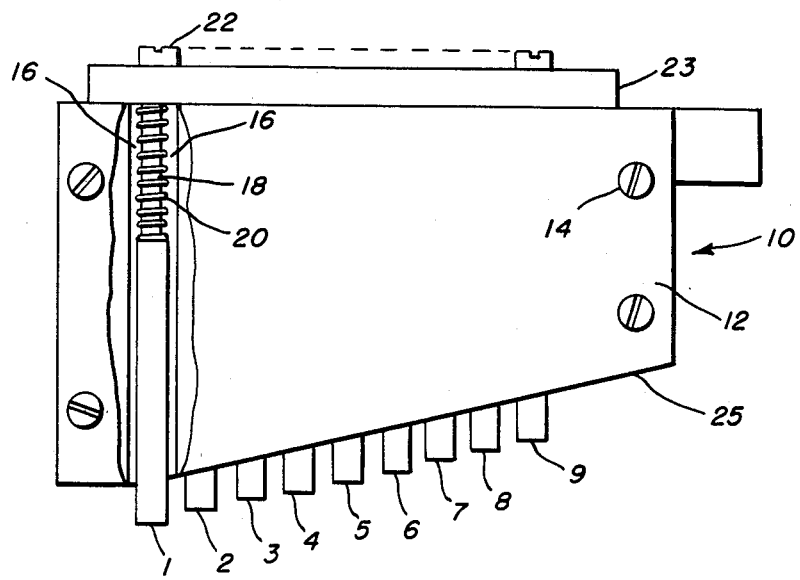
FIG. 1 is an elevational view, partly in section, of a probe holder in accordance with the present invention.

FIG. 1 illustrates a probe holder according to the present invention, generally designated by reference numeral 10. The probe holder comprises a body formed of suitable insulating material, such as plastic or bakelite. A cover 12 is provided to afford access to the interior of holder 10. Cover 12 may be secured by fasteners such as screws 14. A portion of cover 12 is broken away in FIG. 1 for the purpose of illustrating certain interior features of holder 10.

Specifically, holder 10 supports therein a plurality of probes designated 1-9 in FIG. 1. The probes are formed of a carbon-based material. In a preferred embodiment, the probes are formed of silver graphite.

Probe 1, illustrated in detail in FIG. 1, is supported within holder 10 between a pair of guides 16 which form a channel 18. An electrically conductive spring is interposed between probe 1 and electrical terminal 22. Spring 18 and terminal 22 are in electrical contact with each other. Suitable stop means (not shown) may be provided for preventing ejectment of probe 1 from holder 10. Probes 2-9 are supported in holder 10 in like fashion. A plurality of terminals 22, which may be formed using a screw or the like, are provided along a terminal strip 23, one for each probe. Terminals 22 are provided for electrically connecting the probes to measuring means as will be described in greater detail hereinafter. Probes 1-9 extends from a face 25 of the probe which is angled to facilitate mounting thereof, as will also be described hereinafter.

Holder 10 also includes suitable means (not shown), such as a bracket, mounting aperture, or the like for mounting the device to a brush holder in a motor or generator. The specific configuration of the means for mounting holder 10 may vary in accordance with the specific application(s) envisioned.

Figure 2:
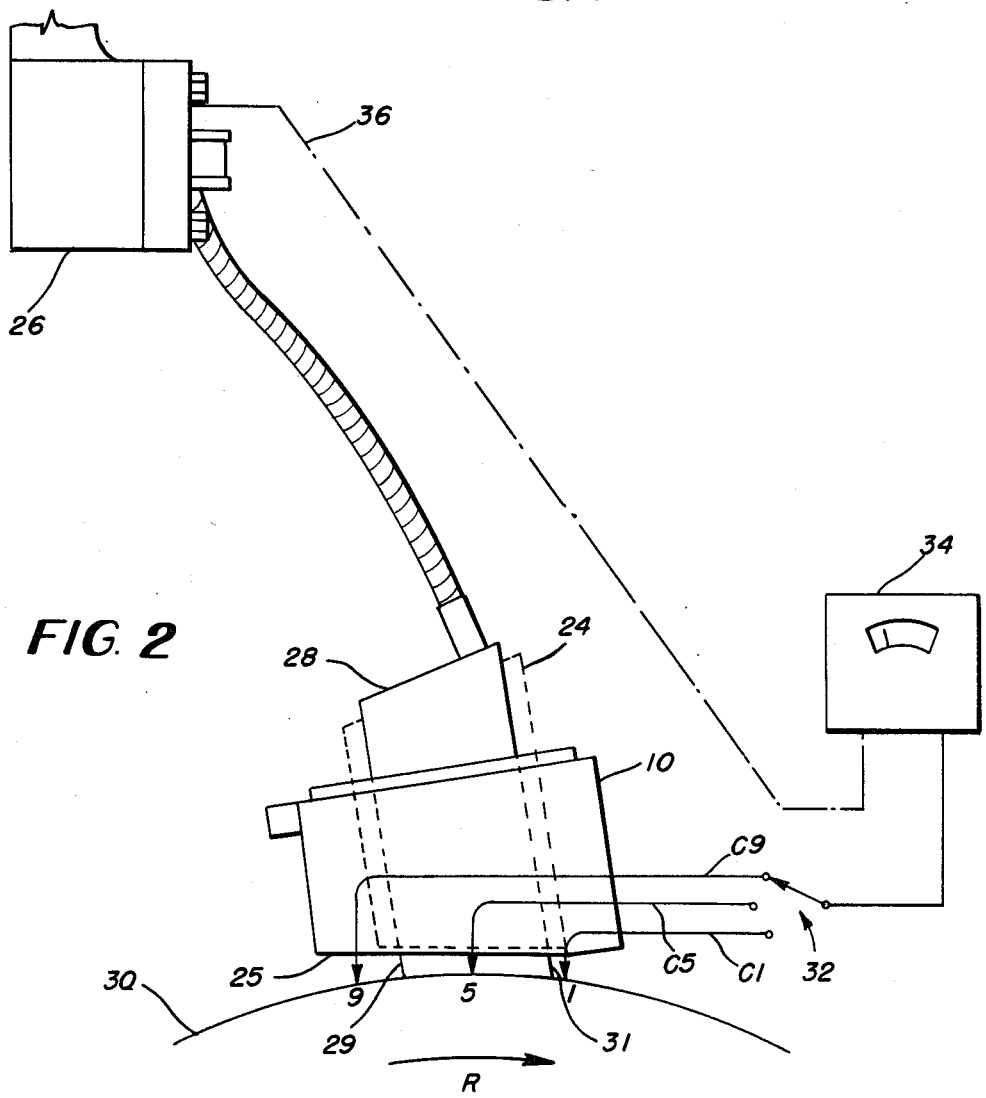
FIG. 2 is an elevational view of the holder of FIG. 1, showing its relationship to a brush and commutator of a machine.

FIG. 2 illustrates the manner in which a probe holder 10 is employed in accordance with the invention. In use, probe holder 10 is secured to a brush holder 24 of the machine to be analyzed. Brush holder 24, which is shown schematically in FIG. 2, is in turn supported by a brush holder bracket 26. A brush 28, a convention element of a motor or generator, is supported by brush holder 24.

Probe holder 10 is mounted alongside brush 28 in such manner that probes 1-9 are in contact with the face of commutator 30 which rotates in the direction designated by arrow R. The angular orientation of face 25 of probe holder 10 facilitates alignment of probes 1-9 substantially along a line tangent to commutator 30, whereby all probes may contact the commutator. The rotating face of the commutator first contacts probe 9, passing sequentially along probes 9-1 in descending numerical order. FIG. 2 illustrates the relative positions of probes 9, 5 and 1. The positions of the remaining probes are omitted for sake of clarity.

Probes 1-9 are connected via conductors C1-C9, respectively to a multi-position switch 32. Again, certain conductors are omitted for sake of clarity. Switch 32 serves to selectively connect each of the probes to a measuring device 34, such as a voltmeter. Device 34 is also connected via a conductor 36 to the support bracket 26 for the brush 28.

While the device of the invention has thus far been described as mounted on a holder 24 in association with a brush 28, other mounting arrangements are also possible. for example, commutator characteristics of a device may be analyzed in the absence of a brush, mounting holder 10 and probes 1-9 in place of the brush. In a multi-brush machine, once brush may be replaced by a holder 10 in accordance with the present invention. What is important is that the probes 1-9 be positioned across the commutator field of the machine so that multiple points of the field may be analyzed, as will be described in greater detail hereinafter.

The manner in which commutating characteristics are determined in accordance with the invention will be described with reference to FIGS. 2 and 4, as well as the graphs of FIGS. 3 and 5A-5B. Generally, the probe holder of the invention is positioned alongside a bush of the motor or generator with the probes thereof in contact with the commutator. A measuring device, such as a voltmeter, is selectively connected to respective probes. The voltmeter is also connected to the brush holder, whereby voltage differentials between the holder and the respective probes may be determined. Measurements may thus be made at various points throughout the commutating field. The voltage differential between the brush holder and the leading probe will normally be higher than the differnetial between the holder and the trailing probe when the commutating field strength and brush position are correct and the machine is carrying full load.

As illustrated in FIG. 2, and as described hereinabove, in use, probe holder 10 of the invention is mounted alongside brush 28 of the machine. Probe holder 10 is oriented such that probe 9 is positioned at the leading edge of the holder while probe 1 is at the trailing edge thereof. All probes are in contact with the commutator 30 rotating in direction R. As is evident from FIG. 2, probe 5, as well as additional adjacent probes (not shown) are directly alongside brush 28 between leading edge 29 and trailing edge 31 of brush 28. The number of probes actually positioned within this zone will depend upon the relative dimensions of brush 28 and the respective probes. Probe 9 is positioned at a location preceeding leading edge 29 of brush 28. Probe 1 is located beyond trailing edge 31 of brush 28 in the direction of rotation. Depending upon the relative dimensions of the brush 28 and the probes, additional probes may likewise precede or trail the leading and trailing edges of brush 28, respectively. Measurements made via probes located beyond the edges of the brush assist in properly locating the brush in the commutating zone, as will be described below.

The manner in which a device in accordance with the invention may be employed to analyze operation of a DC generator will be described with reference to FIG. 3. In the manner discussed above, a probe holder 10 is positioned within a generator comprising brush 28 and commutator 30 as depicted in FIG. 2. The generator is operated and measurements are made of the voltage differential between the brush holder, connected to voltmeter 34 via conductor 36, and each of the probes 1-9. This is accomplished by sequentially connecting the probes to voltmeter 34 via switch 32. The voltage differential measurements may be recorded graphically for the purpose of analysis, as shown in FIG. 3.

If a curve as shown at A in FIG. 3 is obtained, a uniform distribution of current across the face of brush 28 exists. This is an ideal condition for collecting maximum current from the commutator. Such an ideal condition may not be achieved on certain machines. A curve as shown at B represents the best normal load with commutation sloping slightly downward in the direction of rotation. If the full load or available load corresponds to this curve, the adjustment of the commutating field is substantially correct.

If a curve as shown at C is obtained, sloping rapidly downward in the direction of rotation and perhaps crossing the zero voltage line, the commutating field is too strong. If an upwardly sloping curve, as shown at D, is obtained, the commutating field is weak. Based upon information obtained by the above-described analysis, one may determine if the generator is operating properly.

A device in accordance with the invention may also be employed to analyze operation of a motor. This will be described with reference to FIGS. 4 and 5A-5B. This discussion relates to analysis of a DC motor at no load using a device in accordance with the invention.

As shown in FIG. 4, a probe holder 10 is positioned adjacent brush 28 with probes 1-9 in contact with commutator 30 rotating in the direction of arrow R of FIG. 14. The positions of probes 1-9 on commutator 30 are indicated in FIG. 4. As discussed above with resepct to FIG. 2, certain probes are positioned adjacent brush 28 between the leading edge 29 and the trailing edghe 31 thereof. Other probes precede leading edge 29 in the direction of rotation while additional probes are positioned beyond trailing edge 31 in the direction of rotation. The motor is operated at no load and voltage measurements are made via each probe in the manner discussed above. The measurements are plotted graphically for the purpose of analysis.

Polarity reversal of current in an armature coil is ideal when the induced voltage in the coil is zero at a point corresponding to the center line of the brush position. This provides uniform current distribution across the face of the brush. In use, probe holder 10 is positioned adjacent brush 28 in a manner such that probe 5 is positioned at a point corresponding to a projection of the center line CL of brush 28. Thus, under ideal conditions, the voltage reading at probe 5 would be zero. FIG. 5A graphically illustrates a set of measurements which might be obtained in analyzing a motor. The curve shows an inflection point which is translated or offset from the center of the brush (at probe 5) toward the leading edge of the brush (in the direction of probe 9). This indicates that a shift of the brush holder in a direction opposite rotation R is required in order to locate the inflection point at the brush center line. Once the shift is made, the curve representing voltage measurements will appear as shown in FIG. 5B. The inflection point of the curve is along the center line of the brush, corresponding to the position of probe 5. While the reading at probe 5 indicates that an ideal zero-voltage condition has not been achieved, the slightly positive voltage reading at probe 5 indicates that the motor is operating satisfactorily.

In the arrangement illustrated schematically in FIG. 4, only probes 3-7 are positioned directly adjacent brush 28. Probes 8-9 precede the brush in the direction of rotation R while brushes 1 and 2 trail the brush in that direction. Thus, probes 3-7 measure the actual potential at corresponding points along the brush 28. Probes 1-2 and 8-9 provide meaurements which assist in determining the position of the brush 28 within the commutating field. As discussed above, the relative sizes of the probes and of the brush 28, respectively, will determine how many probes will actually be positioned within the boundaries 29 and 31 of the brush.

From the foregoing description, it is evident that a device in accordance with the invention may be advantageously employed to analyze commutating characteristics of motors and generators. The device and method provided by the present invention is accurate, safe and efficient, providing reliable analysis without danger to an operator or technician.

While the invention has been described with reference to the accompanying drawings, it is not limited to the details shown therein as various modifications will be apparent to those of ordinary skill in the art. The invention is limited only by the claims appended hereto.

I claim:

1. In a motor or generator comprising a commutator and a brush, means for determining commutating characteristics comprising:

first means for positioning a plurality of probes in juxtaposition with the brush and in contact with the commutator, said first means comprises a holder for said probes, said probeholder is mounted on a support for the brush, said probes are aligned with a direction of rotation of the commutator, and said probes span a distance greater than the dimension of the brush in the direction of rotation of the commutator; and second means associated with said probes for measuring electrical current charactersitcs of the respective probes, said second means comprises means for measuring electrical current through each of said probes and voltage 2. A method for determining commutating characteristics of a motor or generator comprising a commutator and a brush comprising:

positioning a plurality of probes in juxtaposition to the brush and in contact with the commutator, positioning at least some of said probes at a plurality of positions spaced along a line parallel toa direction of rotation of the commutator and laterally adjacent the brush;

measuring electrical current characteristics in said at least some probes for determining current characteristics at various portion sof the brush;

positioning at least one additional probe before said brush in said direction of rotatio and at least another additional probe after said brush in said direction of rotation; and measuring electrical current characteristics in said additional probes to determine the location of the brush in a commutation zone.

3. The method of claim 2, further comprisnig adjusting the position of the brush with respect to the commutator in accordance with measurements of said electrical current characteristics.

4. In a motor or generator comprising a commutator and brush, a probe assembly means for determining commutating characteristics and for accurately positioning the brush with respect to the commutator comprising:

a probe holder having a plurality of channels formed therein;

a plurality of elongated electrical contact probes positioned within said channels for contacting different surface portions of the commutator;

spring means positioned within said channels for biasing said probes against the surface of the commutator;

electrical contacts connected to said probes;

mounting means attached to said probe holder for securing said holder to the brush at a desired orientation so that said probes are aligned with a direction of rotation of the commutator and said probes span a distance greater than the dimension of the brush in the direction of rotationof the commutator;

measuring means for measuring voltage across each of said probes; and switching means connected to said electrical contacts and said measuring means for selectively connecting said measuring means to said electrical contact for each said probe.

* * * * *